United States Patent [19]

Colvin

[11] 4,449,045
[45] May 15, 1984

[54] LIGHT MONITORING ARRANGEMENT HAVING OPTICALLY COUPLED SATURATION PREVENTING CIRCUITRY

[75] Inventor: Roger Colvin, Portola Valley, Calif.
[73] Assignee: Scientific Technology Incorporated, Mountain View, Calif.
[21] Appl. No.: 264,013
[22] Filed: May 15, 1981
[51] Int. Cl.³ .............................................. H01J 40/14
[52] U.S. Cl. ............................... 250/214 AG; 330/59
[58] Field of Search ............ 250/206, 214 R, 214 AG, 250/214 B, 214 C, 214 RC; 455/619, 605, 608, 611, 614, 615, 616; 330/59; 307/311

[56] References Cited

U.S. PATENT DOCUMENTS

| 3,379,991 | 4/1968 | Clerc et al. | 250/214 AG |
| 4,019,048 | 4/1977 | Maione et al. | 455/608 |
| 4,257,125 | 3/1981 | Theall | 455/608 |
| 4,366,378 | 12/1982 | Simons | 250/214 AG |

Primary Examiner—David C. Nelms
Attorney, Agent, or Firm—Flehr, Hohbach, Test, Albritton & Herbert

[57] ABSTRACT

A light monitoring arrangement, specifically one for monitoring relatively high frequency light pulses and producing corresponding electrical output pulses, is disclosed herein. This arrangement includes circuitry which has the tendency to become electrically saturated if the light pulses being monitored reach or exceed a certain minimum intensity level. This in turn distorts the electrical output pulses in a way which causes these pulses to merge with one another. However, the arrangement disclosed herein also includes circuitry for preventing this from occurring even if the light pulses do reach or exceed circuit saturating intensity levels.

5 Claims, 3 Drawing Figures

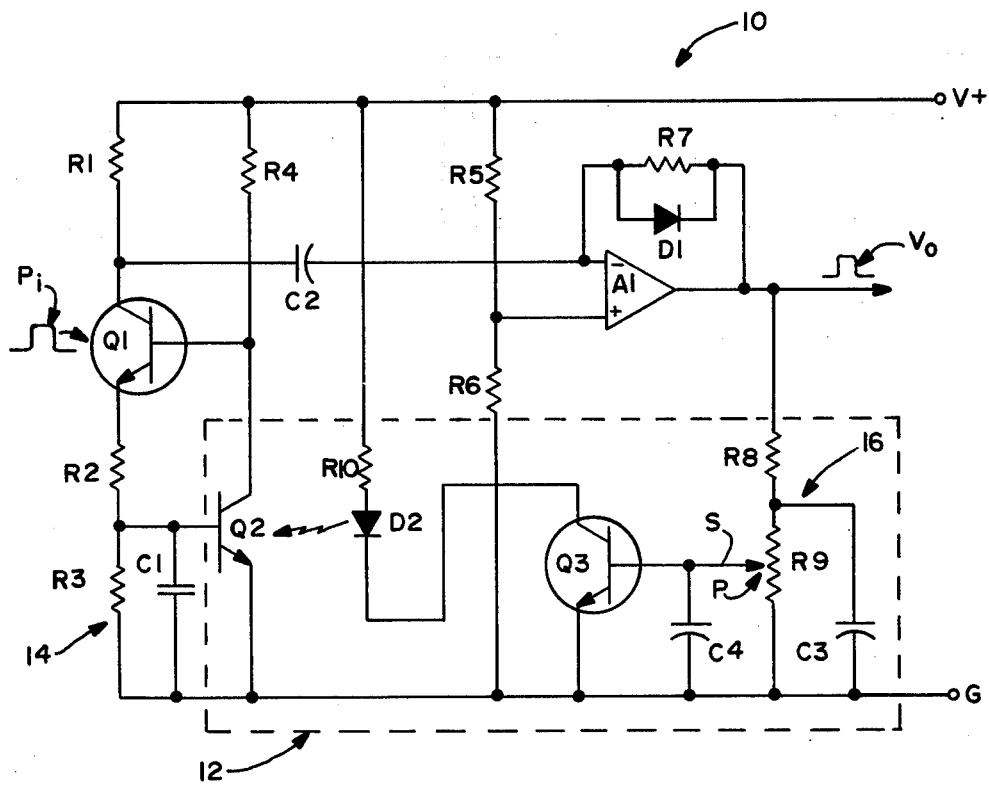
FIG.—1
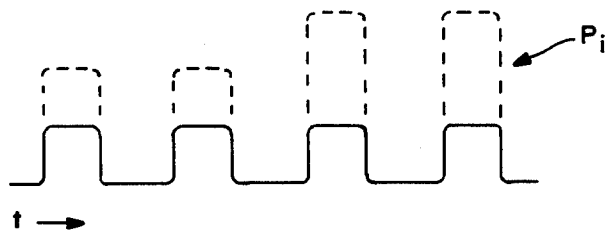
FIG.—2a
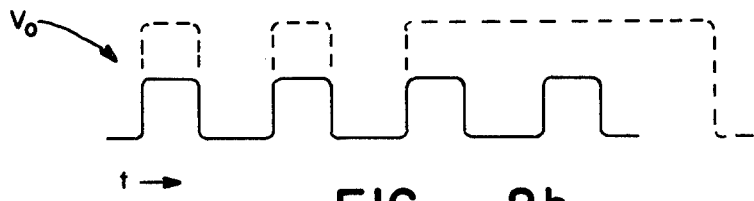
FIG.—2b

LIGHT MONITORING ARRANGEMENT HAVING OPTICALLY COUPLED SATURATION PREVENTING CIRCUITRY

The present invention relates generally to a circuit arrangement for monitoring electromagnetic radiation, specifically relatively high frequency light pulses, and more particularly to a technique for preventing its circuitry from becoming electrically saturated and causing unwanted distortion as a result of sensing electromagnetic radiation having too high an intensity level.

As will be described in more detail hereinafter, the present invention relates to an improvement in a monitoring arrangement of the general type disclosed in U.S. Pat. No. 3,867,628 which issued to Roger M. Brown on Feb. 18, 1975 and which discloses a pulsed light receiver. This receiver includes a light sensitive element, specifically a phototransistor, and associated circuitry for producing an electrical output signal responsive to and indicative of optical input pulses sensed by the light sensitive element, that is, so long as the optical input pulses exceed a predetermined minimum frequency. The circuitry is insensitive to electromagnetic radiation variations below this frequency. For a more detailed discussion of this arrangement and its various other features, reference is made to the Brown patent.

The basic monitoring technique described in the Brown patent recited above has been found to be quite satisfactory for its intended purposes so long as the discrete light pulses being monitored do not increase to a level sufficiently high to electrically saturate the associated circuitry. If this does occur, the electrical output pulses do not tend to increase in amplitude with the increased intensity level of the input pulses but rather widen or stretch horizontally until they actually merge with one another so as to form a single continuous output. This distorted output prevents proper monitoring of the input pulses.

In view of the foregoing, one object of the present invention is to provide an uncomplicated, reliable and yet economical circuit network for preventing the circuitry making up a monitoring arrangement of the general type described in the above-recited Brown patent from becoming electrically saturated and causing output distortion of the type described as a result of and in response to high intensity inputs.

A more specific object of the present invention is to provide a saturation preventing circuit network which can be readily incorporated into circuitry of the type described in the Brown patent without functionally changing this latter circuitry.

Another specific object of the present invention is to provide a light monitoring circuit arrangement including an optically coupled saturation preventing circuit.

As will be described in more detail hereinafter, the electrical circuit arrangement disclosed herein is one which monitors the presence or absence of specific electromagnetic radiation at a given point. In the actual embodiment illustrated, the electromagnetic radiation monitored is comprised of relatively high frequency pulses of light. Low frequency radiation variations sensed by the arrangement are attenuated before reaching its output, as in the Brown patent. The circuit arrangement disclosed herein also uses electrically saturable circuitry including a device which senses ambient radiation if present, and cooperating electrical circuitry. This latter circuitry is responsive to the radiation sensed for producing a corresponding electrical output signal so long as the amount of electromagnetic radiation sensed does not reach a level sufficiently high to electrically saturate the first-mentioned circuitry and thereby distort the output signal. In the particular embodiment illustrated, the electrical output signal takes the form of discrete electrical pulses which stretch and merge with one another as described above if the first circuitry is allowed to become electrically saturated. However, in accordance with the present invention, the monitoring arrangement disclosed herein also includes a circuit network connected with the first circuitry for preventing the latter from becoming electrically saturated sufficient to distort its output signal in the event the radiation sensed does reach the saturation level.

The specific features of this saturation preventing circuit means and the monitoring arrangement generally will be described in more detail hereinafter in conjunction with the drawing wherein:

FIG. 1 is a schematic illustration of an electrical circuit arrangement which is provided for monitoring the presence or absence of specific electromagnetic radiation and which includes a saturation preventing circuit designed in accordance with the present invention; and FIGS. 2a and 2b diagramatically illustrate optical input signals and electrical output signals, respectively, associated with the arrangement illustrated in FIG. 1.

Turning now to the drawing, attention is first directed to FIG. 1 which illustrates an overall circuit arrangement 10 for monitoring at its input ambient electromagnetic radiation, specifically periodic light pulses $P_i$, one of which is illustrated in FIG. 1. As will be seen below, arrangement 10 includes a number of interconnected components which function in a manner similar to the circuitry described in the previously recited Brown patent so as to provide electrical output pulses or signals $V_o$, one of which is illustrated in FIG. 1. These output pulses or signals are produced in response to the presence of input pulses $P_i$ at the input to arrangement 10 and each output signal is intended to display an amplitude which corresponds to the intensity of an associated input pulse. Like the Brown circuitry, arrangement 10 includes its own circuitry for attenuating low frequency inputs such as relatively slow changes in the light level of the ambient surroundings. However, as will also be seen hereinafter, arrangement 10 includes a network 12 (within the dotted box) for preventing the overall arrangement from becoming electrically saturated and distorting its output in the manner described as a result of undesirably high levels of electromagnetic radiation at its input.

The various components making up overall arrangement 10, with the exception of network 12, include a photosensitive input device, specifically the photo-transistor Q1 illustrated in FIG. 1. This device has its collector connected through a load resistor R1 to a suitable power supply generally indicated by +V. Its emitter is connected to one side of a resistor R2. The other side of resistor R2 is connected to one side of a low pass RC filter network 14 consisting of resistor R3 and capacitor C1. The other side of filter network 14 is connected to ground voltage generally indicated at G. The low pass filter network is connected to the base of a second photo-sensitive device, specifically the photo-transistor Q2 illustrated in FIG. 1. This device serves as a conventional transistor, that is, one which is not photo-sensitive in cooperation with low pass filter network 14 and also as a photo-transistor in saturation preventing network 12, as will be discussed hereinafter. As seen in FIG. 1, the collector of photo-transistor Q2 is connected to the base of photo-transistor Q1 and also to the power supply through a load resistor R4 and its emitter is connected to ground potential.

The output of photo-transistor Q1, specifically its collector, is connected through a high pass filter capacitor C2 to one input of a high gain feedback amplifier A1. The other input of this amplifier is connected between resistors R5 and R6. The otherwise free side of resistor R5 is connected to the power supply and the otherwise free side of resistor R6 is connected to ground. The amplifier includes a feedback network consisting of resistor R7 and parallel diode D1.

With the exception of photo-transistor Q2 as used in network 12 and the nework itself, the various components of arrangement 10 thus far described cooperate with one another and with photo-transistor Q2 to function in the same general way as the circuitry illustrated and described in the previously recited Brown patent. More specifically, as a lght pulse above a predetermined minimum frequency appears at the photo-transistor Q1, for example the light pulse $P_i$, the photo-transistor causes a corresponding signal to be applied to the input of the high gain feedback amplifier A1. The amplifier in turn produces a corresponding output signal in the form of output pulse $V_o$ which is responsive to the initial input pulse $P_i$ and displays an amplitude which corresponds to the intensity of the input pulse, that is, so long as the circuitry is not saturated, as will be discussed hereinafter.

In accordance with the intended way in which overall monitoring arrangement 10 operates, the photo-transistor Q1 is exposed not only to input pulses $P_i$ but also to the ambient surroundings. In this regard, it has been found that the light intensity in the ambient surrounding has the tendency to change, although these changes take place rather slowly relative to the changes in light intensity at the photo-transistor caused by input pulses $P_i$. In order to prevent these ambient changes from affecting operation of monitoring arrangement 10, the latter includes the previously recited filter nerwork 14 in conjunction with photo-transistor Q2 and the previously recited high pass filter capacitor C2. During normal operation of arrangement 10, input pulses $P_i$ result in corresponding high frequency electrical signals appearing at the input of low pass filter network 14 while, at the same time, changes in the ambient surroundings result in relatively low frequency electrical signals. The resistor R3 and capacitor C1 making up network 14 are selected to pass signals below a predetermined frequency including the low frequency signal just mentioned to the base of photo-transistor Q2. At the same time, network 14 prevents high frequency signals including the signals corresponding to input pulses $P_i$ from reaching the base of photo-transistor Q2. In this regard, the photo-transistor could be a conventional, that is, one which is not photo-sensitive, as in the Brown patent. In any event, the low frequency signals reaching the base of the device Q2 cause the latter in conjunction with load resistor R4 to control the photo-transistor Q1 such that its output (the signal reaching amplifier A1) is unaffected by changes in the ambient surroundings or similar low frequency inputs. The high pass filter capacitor C2 aids in accomplishing this by passing to the amplifier only signals above a predetermined frequency, that is, signals including those which correspond to the inputs $P_i$ while excluding light changes falling below the specified frequency including changes in the ambient surroundings.

It is to be understood that the circuitry thus far described including the way it functions to provide output signals $V_o$ in response to input light pulses $P_i$ is readily available in the prior art, specifically in the above recited Brown patent, and hence does not by itself form part of the present invention. Moreover, so long as the input pulses $P_i$ or any other responsive electromagnetic radiation does not saturate the circuitry, the presence of the input pulses as illustrated by solid line in FIG. 2a will result in corresponding electrical output signals $V_o$ illustrated by solids lines in FIG. 2b. However, should the input to photo-transistor Q1 be of sufficient intensity to saturate the photo-transistor and/or the rest of the circuitry making up arrangement 10, it has been found that this results in a specifically distorted output signal $V_o$. This is best illustrated by the dotted lines in FIGS 2a and 2b. As seen in these latter figures, as the input pulses $P_i$ increase in intensity, the output pulses $V_o$ increase in amplitude. However, should the intensity of the input pulses increase above a particular threshold level, e.g. to a level at which the corresponding output signal $V_o$ should rise above supply $+V$, as in the case of the third and fourth pulses in the train illustrated in FIG. 2a, the circuitry becomes saturated and this, in turn, causes the corresponding output pulses $V_o$ to stretch horizontally since they cannot increase vertically (because of a lack of supply voltage). If the input pulses are sufficiently high, the output signals will merge with one another, as illustrated, thereby eliminating any possibility of monitoring the presence of the input pulses. As will be seen below, network 12 is incorporated into the overall arrangement to prevent the circuitry from saturating, even if the photo-transistor is subjected to the light intensity level above the saturation threshold.

As seen in FIG. 1, network 12 includes a load resistor R8, a variable resistor in the form of a potentiometer P consisting of resistive element R9 and slide element S, and capacitors C3 and C4. The first of these latter capacitors is connected across the entire resistive element R9 and the latter is connected across a portion thereof, depending upon the position of slide element S. The slide element is also connected to the base of a transistor Q3. The emitter of this transistor is connected to ground and its collector is connected to one side of a light emitting diode D2. The other side of the light emitting diode is connected through a load resistor R10 to power supply $+V$.

From a functional standpoint, the load resistor R8, the potentiometer P and the capacitors C3, C4 together form a low pass filter circuit 16 which serves to integrate the electrical output pulses from amplifier A1 and provide an average DC level. The potentiometer serves to apply an adjustable portion of this integrated signal to the base of transistor Q3 for controlling the conduction level of the latter. More specifically, potentiometer P is adjusted such that the portion of the integrated signal used to control transistor Q3 is just sufficient to turn the latter on (make it conduct) when the circuitry arrangement reaches its saturation level, e.g., when the amplitude of the output $V_o$ is equal to the supply voltage $+V$. An increase in the integrated signal will increase conduction of transistor Q3 and a decrease in the integrated signal will decrease conduction of the transistor. As seen in FIG. 1, transistor Q3 is in series circuit with light emitting diode D2 and resistor R10. As a result, the output from the integrating circuitry which controls the conduction level of transistor Q3 also controls the amount of current passing through the light emitting diode and, hence, the amount of light emitted from the latter. As stated previously, light emitting diode D2 is in optical alignment with photo-sensitive transistor Q2.

In operation, the potentiometer is adjusted so that the output from integrating circuit 16 will turn on transistor Q3 only at the point that the overall circuit reaches saturation, as stated above. If the circuit does not reach saturation, the control transistor Q3 will not turn on and overall network 12 will remain inoperative with respect to the rest of the circuitry making up arrangement 10 and this latter arrangement will function in the manner generally described above and in the previously recited Brown patent. However, at the point that the overall circuit reaches saturation, the integrated signal from circuit 16 becomes sufficiently great to cause the control transistor to turn on which, in turn, causes current to pass through the light emitting diode D2. Light from the latter falls on the photo-sensitive transistor Q2 causing its bias to change so as to reduce its output and therefore output signal $V_o$ independent of input pulses $P_i$. This continues until the overall circuitry moves just to its saturation level, e.g. until signal $V_o$ falls to the supply level.

From the foregoing, it should be apparent that network 12 serves to prevent the overall circuitry making up arrangement 10 from saturating and distorting output pulses $V_o$ in the manner described previously. While the circuitry to accomplish this is preferably of the type described, it is to be understood that other combinations of circuit components serving the same function are within the scope of the present invention. For example, a specific integration circuit may be used in lieu of the low pass filter circuit 16 which serves as an integrating circuit.

What is claimed is:

1. An electrical circuit arrangement for monitoring the presence or absence of discrete light pulses displaying a minimum frequency at a given point, said arrangement comprising: a first circuit including a first light sensitive device for sensing the light present at said point including said minimum frequency pulses, if the latter are present, and cooperating electrical circuitry responsive to all of the light sensed for producing discrete electrical output pulses which correspond to said minimum frequency pulses if the latter are sensed and so long as the light pulses sensed do not reach an intensity level sufficiently high to electrically saturate said first circuit means and thereby distort said output pulses by causing the latter to merge with one another, said cooperating circuitry including a second light sensitive device and associated circuitry connected with the latter and said first light sensitive device, said second light sensitive device and its associated circuitry together forming a control network for preventing changes in light which appear at said given point but at a frequency below said minimum pulse frequency from affecting said output pulses, said control network also controlling operation of said first circuit sufficient to prevent electrical saturation of the latter when an appropriate amount of light is applied to said second light sensitive device and even though the intensity of the light pulses sensed reaches said sufficiently high level; and a second circuit including a light producing device in optical alignment with said second light sensitive device and cooperating circuitry which is connected with said first circuit and which is responsive to said output pulses for controlling said light producing device such that the latter applies the appropriate amount of light onto said second light sensitive device to prevent said first circuit from becoming saturated in the event the intensity of the sensed light pulses reaches said sufficiently high level.

2. An arrangement according to claim 1 wherein said cooperating circuitry of said second circuit includes means for integrating said output pulses when the latter are present and means responsive to said integrated pulses for controlling the amount of light provided by said light producing device.

3. An arrangement according to claim 1 wherein said integrating means includes a low pass filter circuit means whereby to provide an average DC voltage level from the integrated output pulses.

4. An arrangement according to claim 3 wherein said means responsive to said integrated pulses includes a transistor having its emitter and collector connected in series with said light producing device and its base connected with said low pass filter circuit means.

5. An arrangement according to claim 4 wherein said second light sensitive device is a photo-transistor and said light producing device is a light emitting diode.

* * * * *